(12) United States Patent
Bely et al.

(10) Patent No.: US 7,170,178 B2
(45) Date of Patent: Jan. 30, 2007

(54) CAPACITIVE INTEGRATED CIRCUIT STRUCTURE

(75) Inventors: Mickaël Bely, Grenoble (FR); Mounir Boulemnakher, Grenoble (FR); Olivier Noblanc, Grenoble (FR)

(73) Assignee: STMicroelectronics SA, Montrouge (FR)

( * ) Notice: Subject to any disclaimer, the term of this patent is extended or adjusted under 35 U.S.C. 154(b) by 76 days.

(21) Appl. No.: 11/123,831

(22) Filed: May 6, 2005

(65) Prior Publication Data

US 2005/0259379 A1 Nov. 24, 2005

(30) Foreign Application Priority Data

May 7, 2004 (FR) .................................. 04 04992

(51) Int. Cl.
*H01L 23/48* (2006.01)
*H01L 23/52* (2006.01)
*H01L 29/40* (2006.01)
*H01L 29/76* (2006.01)
*H01L 29/94* (2006.01)

(52) U.S. Cl. ...................... 257/758; 257/296; 257/532; 257/774

(58) Field of Classification Search ................ 257/296, 257/532, 774, 758
See application file for complete search history.

(56) References Cited

U.S. PATENT DOCUMENTS 5,208,725 A 5/1993 Akcasu

| | | |
|---|---|---|
| 5,583,359 A | 12/1996 | Ng et al. |
| 6,297,524 B1 | 10/2001 | Vathulya et al. |
| 2004/0041268 A1* | 3/2004 | Montagnana ............... 257/758 |
| 2004/0104449 A1* | 6/2004 | Yoon et al. ................. 257/528 |

OTHER PUBLICATIONS

Aparicio, R. "Capacity Limits and Matching Properties of Integrated Capacitors", IEEE Journal of Solid-State Circuits, IEEE, Inc., vol. 37, No. 3, Mar. 2002, pp. 384-393, XP002252607.
French Preliminary Search Report dated Sep. 21, 2004 for French Application No. 04 04992.

* cited by examiner

*Primary Examiner*—Kenneth Parker
*Assistant Examiner*—Jesse A. Fenty
(74) *Attorney, Agent, or Firm*—Lisa K. Jorgenson; Stephen Bongini; Fleit, Kain, Gibbons, Gutman, Bongini & Bianco P.L.

(57) ABSTRACT

A capacitive structure is provided that includes secondary stacks of superposed secondary electrodes that each include transverse branches connected via a longitudinal branch, means for connecting the superposed secondary electrodes of each of the stacks, first and second means for successively and alternately connecting so as to constitute a first secondary group of secondary stacks and a second secondary group of secondary stacks, at least two principal stacks of superposed principal electrodes which each include transverse branches that are connected via a longitudinal branch such that the transverse branches of the principal electrodes and the transverse branches of the secondary electrodes of the rows extend opposite one another and between one another in an alternating fashion, means for connecting the superposed principal electrodes of each of the principal stacks, and means for connecting the principal stacks so as to constitute a group of stacks of principal electrodes.

18 Claims, 4 Drawing Sheets

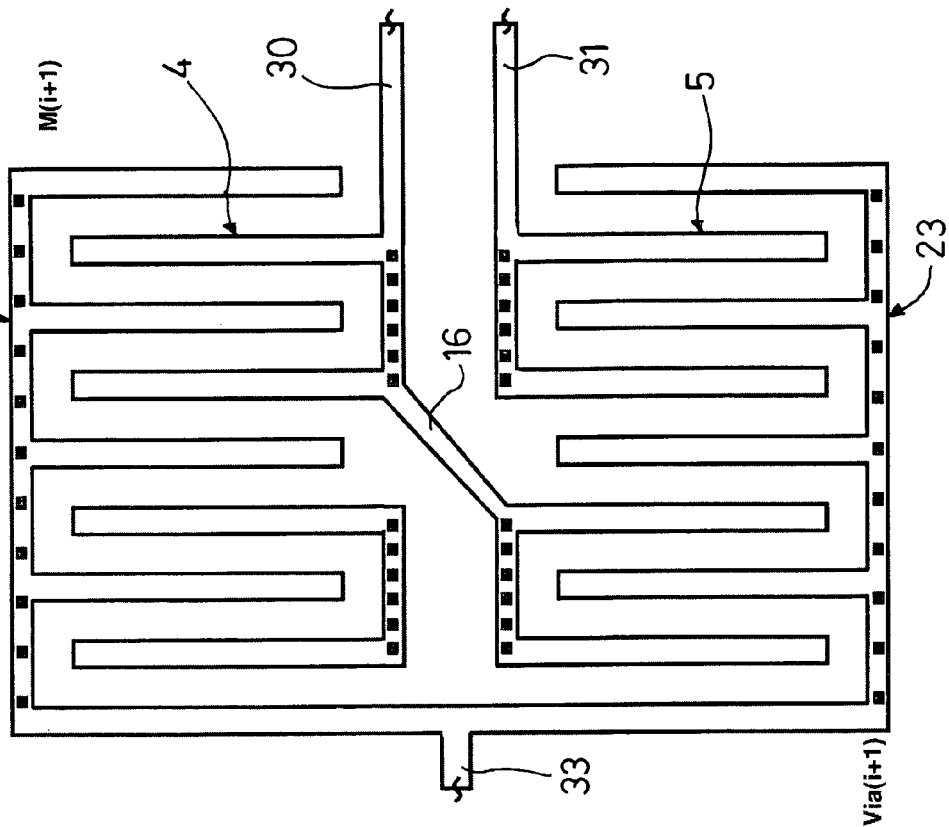
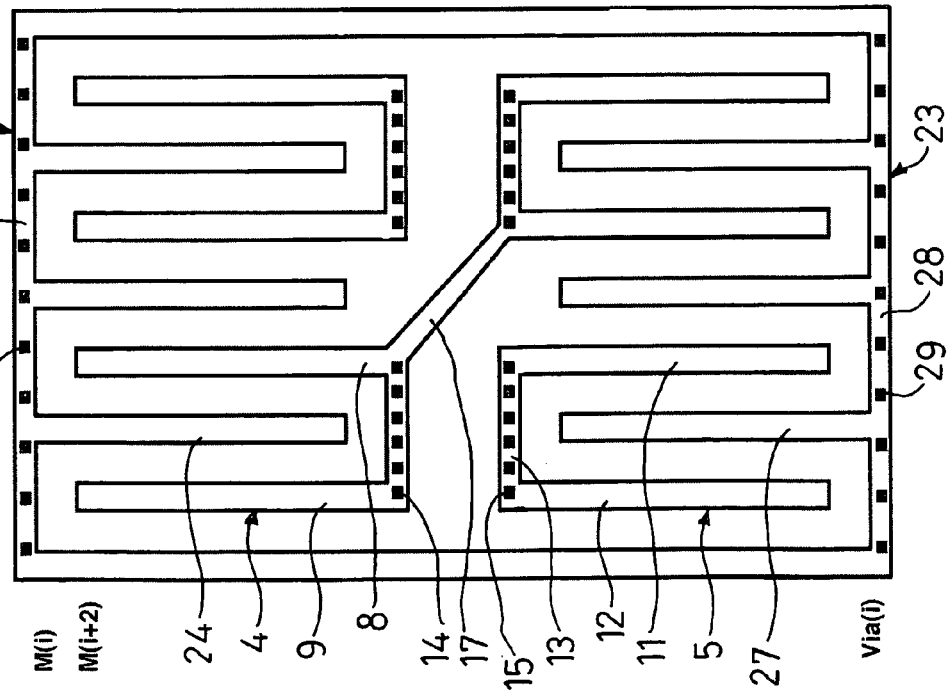

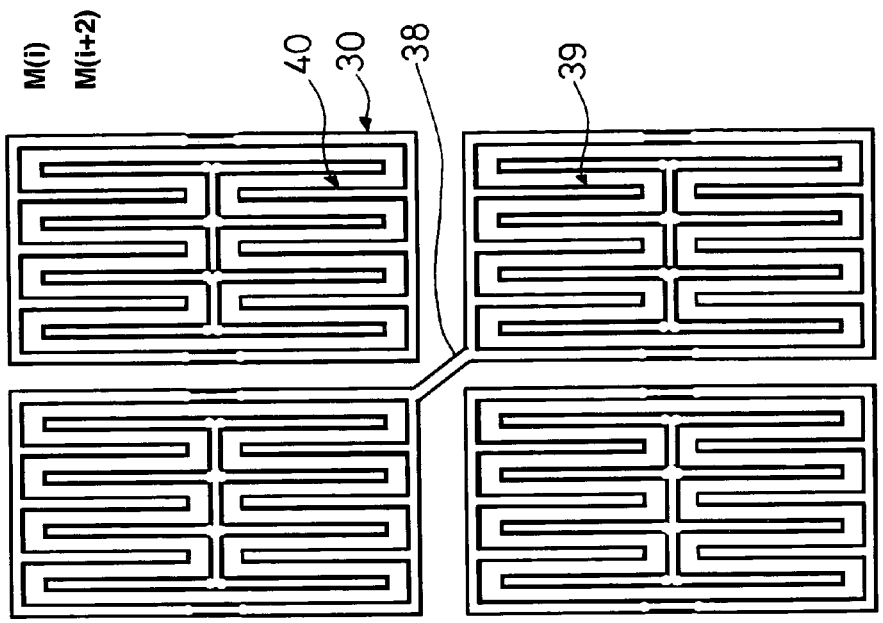
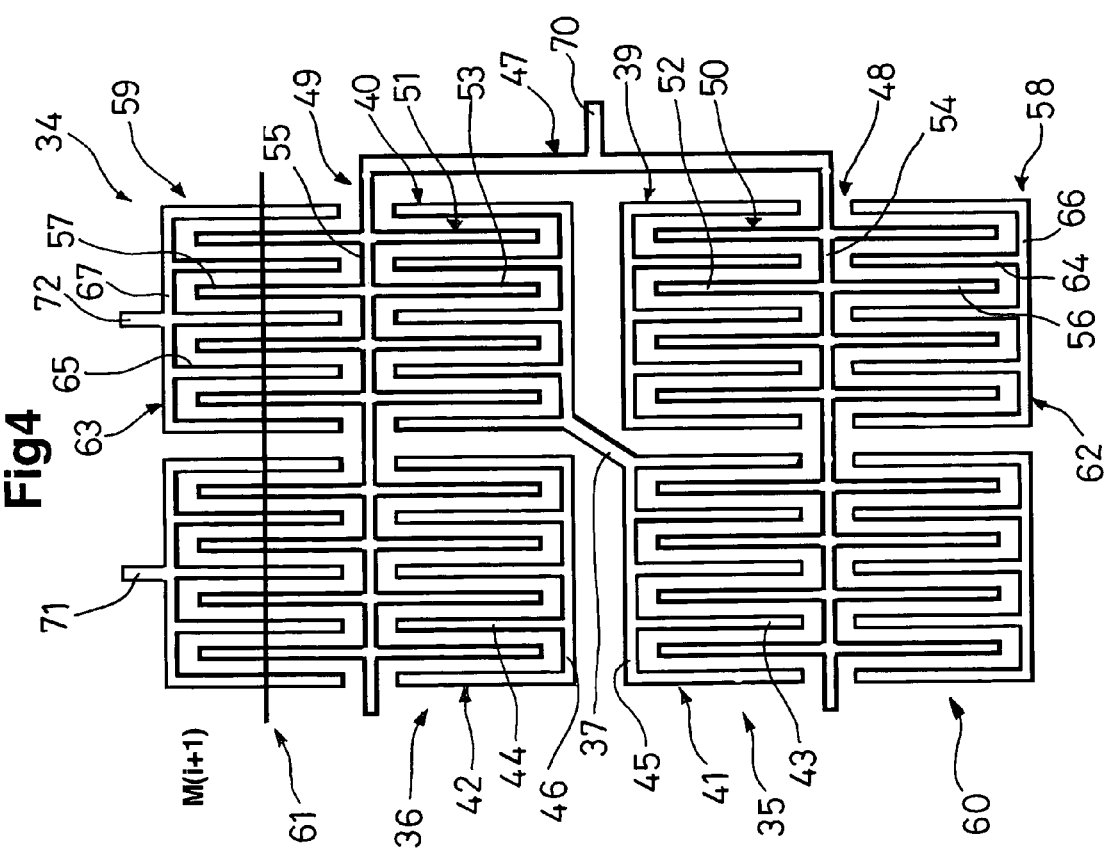

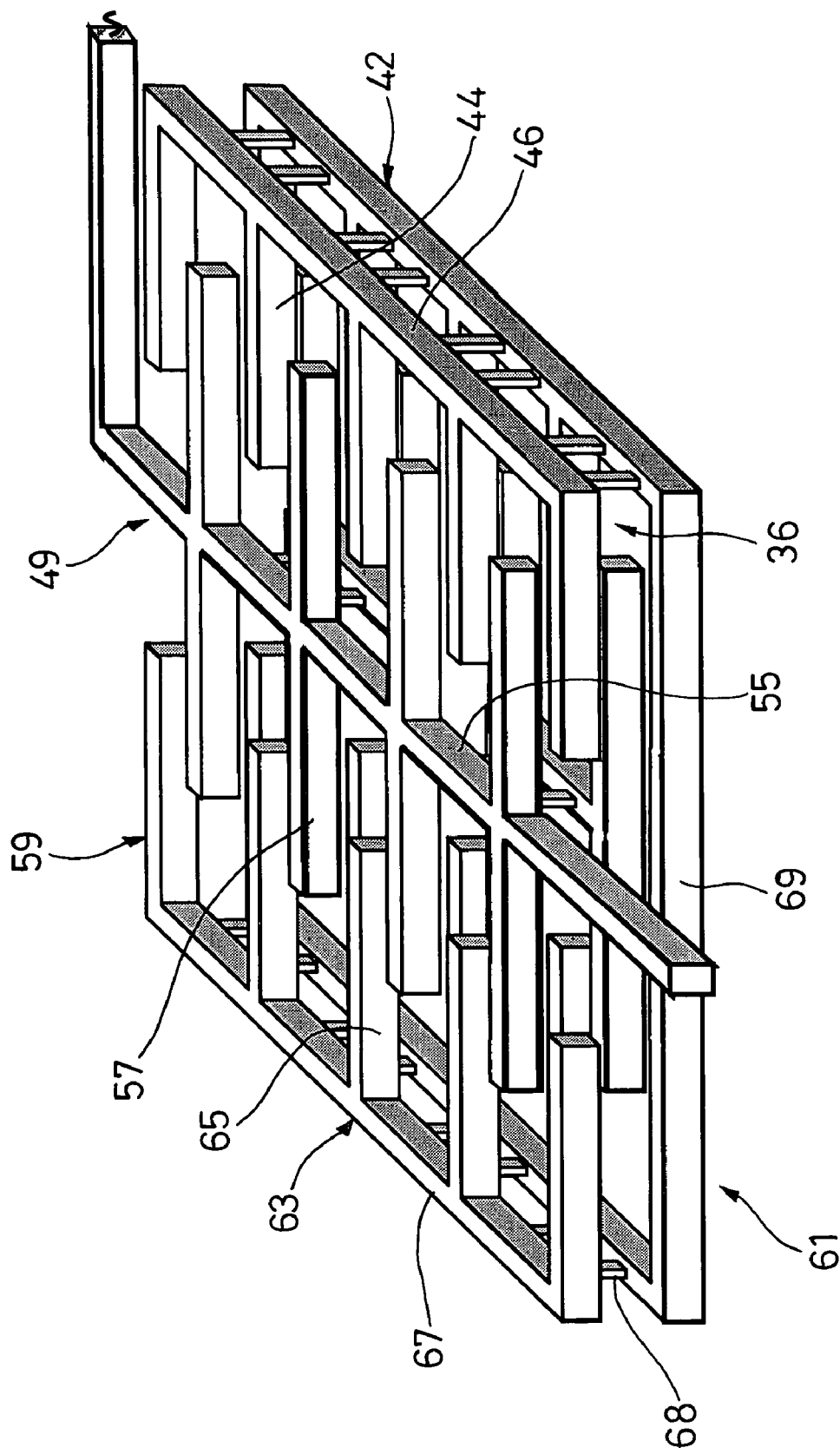
FIG_6

CAPACITIVE INTEGRATED CIRCUIT STRUCTURE

CROSS-REFERENCE TO RELATED APPLICATIONS

This application is based upon and claims priority from prior French Patent Application No. 04 04992, filed May 7, 2004, the entire disclosure of which is herein incorporated by reference.

FIELD OF THE INVENTION

The present invention relates to the field of integrated circuits, and more specifically to integrated circuits that include capacitive structures.

BACKGROUND OF THE INVENTION

In some integrated circuits it is desirable to produce capacitive structures, for example of the MOM type, that can be electrically associated with analog-to-digital converters or digital-to-analog converters.

U.S. Pat. No. 6,111,742 and French Patent Application No. 97 11966 disclose capacitive structures intended for such an application. However, these structures have the drawbacks of being bulky when it is desired to obtain high capacitance values, of having high stray capacitances due to their coupling with the substrate, of generating edge effects and of not making it possible to obtain divided or relative capacitors tending towards equality.

SUMMARY OF THE INVENTION

It is an object of the present invention to reduce the above-mentioned drawbacks.

One embodiment of the present invention provides a capacitive structure that includes secondary stacks of superposed secondary electrodes, third connection means for connecting the superposed secondary electrodes of each of the secondary stacks, first and second connection means for successively and alternately connecting the secondary stacks of one row to the secondary stacks of another row, at least two principal stacks of superposed principal electrodes, fourth connection means for connecting the superposed principal electrodes of each of the principal stacks, fifth connection means for connecting the principal stacks so as to constitute a principal group of principal stacks of principal electrodes, and electrical connection branches. The secondary stacks of superposed secondary electrodes are arranged in at least two longitudinal rows and transversely face one another, with each of the secondary electrodes including transverse branches connected by a longitudinal branch such that the longitudinal branches face one another. The first and second connection means connect the secondary stacks so as to constitute a first secondary group of secondary stacks that are connected together and a second secondary group of secondary stacks that are connected together, such that the secondary stacks of the first secondary group are located transversely facing the secondary stacks of the second secondary group and such that, in each row, the secondary stacks of the first secondary group and the secondary stacks of the second secondary group are arranged alternately. Each of the principal electrodes includes transverse branches that are connected by a longitudinal branch, such that the longitudinal branches of the principal electrodes extend in front of and at a certain distance from the ends of the transverse branches of the rows of secondary electrodes, and such that the transverse branches of the principal electrodes and the transverse branches of the secondary electrodes of the rows extend opposite one another and between one another in an alternating fashion. A first electrical connection branch is connected to the first secondary group of secondary stacks, a second electrical connection branch is connected to the second secondary group of secondary stacks, and a third electrical connection branch is connected to the principal group of principal stacks.

Another embodiment of the present invention provides an integrated circuit that includes such a capacitive structure.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

BRIEF DESCRIPTION OF THE DRAWINGS

FIG. 2 shows a top view of one level of the capacitive structure of FIG. 1;

FIG. 3 shows a top view of another level of the capacitive structure of FIG. 1;

FIG. 4 shows a top view of one level of a capacitive structure according to another embodiment of the present invention;

FIG. 5 shows a top view of another level of the capacitive structure of FIG. 4; and FIG. 6 shows a perspective view of a portion of the capacitive structure of FIGS. 4 and 5.

DETAILED DESCRIPTION OF PREFERRED EMBODIMENTS

Figure 1:
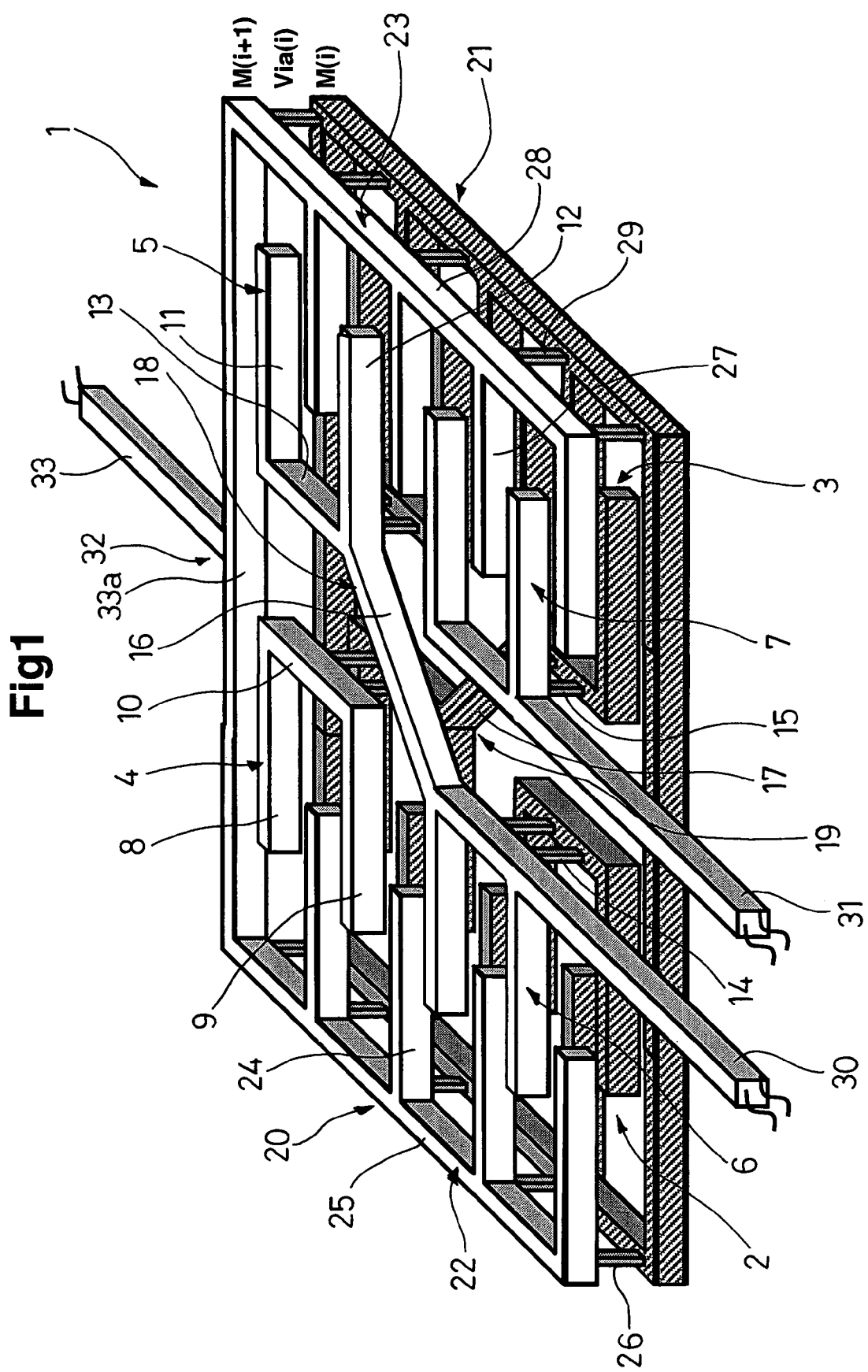
FIG. 1 shows a perspective view of a capacitive base structure according to one embodiment of the present invention.

Preferred embodiments of the present invention will be described in detail hereinbelow with reference to the attached drawings.

A preferred embodiment of the present invention provides a capacitive structure that is produced in levels of an integrated circuit. The capacitive structure includes secondary stacks of superposed secondary electrodes arranged in at least two longitudinal rows and transversely facing one another, means for connecting the superposed secondary electrodes of each of the stacks, first and second means for successively and alternately connecting the secondary stacks of one row to the secondary stacks of the other row, at least two principal stacks of superposed principal electrodes, means for connecting the superposed principal electrodes of each of the principal stacks, means for connecting the principal stacks so as to constitute a group of stacks of principal electrodes, and electrical connection branches. In the secondary stacks of superposed secondary electrodes, each secondary electrode includes transverse branches connected via a longitudinal branch in such a way that the longitudinal branches are facing one another. The first and second means successively and alternately connect the secondary stacks of one row to the secondary stacks of the other row so as to constitute a first secondary group of secondary stacks that are connected together and a second secondary group of secondary stacks that are connected together, such that the stacks of the first secondary group are located transversely facing the stacks of the second secondary group and such that, in each row, the stacks of the first secondary group and the stacks of the second secondary group are arranged alternately. The at least two principal stacks of superposed principal electrodes include respective transverse branches that are connected via a longitudinal branch, with these being arranged in such a way that the longitudinal branches of the principal electrodes extend respectively in front of and at a certain distance from the ends of the transverse branches of the rows of secondary electrodes and in such a way that the transverse branches of the principal electrodes and the transverse branches of the secondary electrodes of the rows extend opposite one another and between one another in an alternating fashion. The electrical connection branches are connected to the first and second secondary groups of secondary stacks and to the principal group of principal stacks, respectively.

According to one embodiment of the present invention, the means for connecting the aforementioned electrodes comprise vias that connect their longitudinal branches.

In some embodiments, the means for connecting the secondary stacks of the secondary groups comprise linking branches that are formed in different levels and intersect each other.

Preferably, the longitudinal branches of the secondary electrodes of each row are aligned.

According to one embodiment of the present invention, the principal electrodes comprise complementary transverse branches opposite their aforementioned transverse branches, and the capacitive structure includes complementary secondary stacks, means for connecting the complementary secondary electrodes of each of the complementary secondary stacks, and means for connecting the complementary secondary stacks to the secondary stacks. The complementary secondary stacks comprises complementary secondary electrodes consisting of respective transverse branches connected via a longitudinal branch, with the complementary secondary stacks being arranged in such a way that the longitudinal branches of the complementary secondary electrodes extend in front of and at a certain distance from the ends of the complementary transverse branches of the principal electrodes and that the complementary transverse branches of the principal electrodes and the transverse branches of the complementary secondary electrodes extend between one another in an alternating fashion.

Preferably, the complementary secondary electrodes placed one above another are connected via vias that connect their longitudinal branches.

Exemplary embodiments of the present invention will now be described in detail with reference to the figures.

FIGS. 1 to 3 show a capacitive base structure 1 of an integrated circuit according to one embodiment of the present invention. The capacitive structure 1 is produced in multiple metal levels of the integrated circuit and includes secondary stacks 2 and 3 of secondary electrodes 4 and 5 that are respectively produced in different metal levels and superposed. The secondary stacks 2 and 3 are arranged in two longitudinal rows 6 and 7 and transversely face each other, with a given longitudinal pitch P.

The secondary electrodes 4 of the stacks 2 of the row 6 each include two transverse branches 8 and 9 and one longitudinal branch 10, with the longitudinal branches 10 produced in each level being aligned.

The secondary electrodes 5 of the stacks 3 of the row 7 each include two transverse branches 11 and 12 and one longitudinal branch 13, with the longitudinal branches 13 produced in each level being aligned.

The secondary electrodes 4 and 5 are identical, with the distance separating them longitudinally in each level being equal to the distance between their transverse branches.

The longitudinal branches 10 of the secondary electrodes 4 of the stacks 2 of the row 6 and the longitudinal branches 13 of the secondary electrodes 5 of the stacks 3 of the row 7 are opposite one another transversely, with their transverse branches 8 and 9 and their transverse branches 11 and 12 being opposite one another in such a way that in each level the secondary electrodes 4 and 5 constitute opposed interrupted combs.

Thus, in each level, the two rows of secondary electrodes 4 and 5 constitute combs interrupted in the longitudinal direction, the branches of which are opposed.

The secondary electrodes 4 of the stacks 2 of the row 6 are connected by vias 14 that connect their longitudinal branches 10, and the secondary electrodes 5 of the stacks 3 of the row 7 are connected by vias 15 that connect their longitudinal branches 13.

In one level, one stack 2 in two of the row 6 is connected, successively and alternately, to the stacks 3 of the row 7 adjacent to the stack 3 facing them, that is to say adjacent to the stacks longitudinally offset by a pitch P of the row 7, by inclined branches 16 connecting their longitudinal branches 10 and 13.

In another level, the other stacks 2 of the row 6 are connected, successively and alternately, to the other stacks 3 of the row 7 by inclined branches 17, which stacks are offset longitudinally by a pitch P, with these branches 17 connecting their longitudinal branches 10 and 13.

Thus, the branches 16 and 17 cross over each other a certain distance apart.

It follows that what are produced are a first group 18 of stacks that is formed in succession from a stack 2 of the row 6 and from a stack 3 of the row 7 adjacent to this stack 2, and a second group 19 formed in succession from a stack 3 of the row 7 and from a stack 2 of the row 6 adjacent to this stack 3 in such a way that, in the row 6, the stacks 2 belong alternately to the first group 18 and to the second group 19 and in such a way that, in the row 7, the stacks 3 belong alternately to the second group 19 and to the first group 18.

The structure 1 furthermore includes principal stacks 20 and 21 of superposed principal electrodes 22 and 23 produced in the aforementioned metal levels and associated with the rows 6 and 7 of secondary electrodes 4 and 5.

The principal electrodes 22 include transverse branches 24 and one longitudinal branch 25, with these being arranged in such a way that in each level the longitudinal branches 25 of the principal electrodes 22 extend in front of and at a certain distance from the ends of the transverse branches 8 of the secondary electrodes 4 and in such a way that the transverse branches 24 of the principal electrodes 22 and the transverse branches 8 of the secondary electrodes 4 extend opposite one another and between one another in an alternating fashion, with the ends of the transverse branches 24 being at a certain distance from the longitudinal branches 10.

The principal electrodes 22 are connected by vias 26 that connect their longitudinal branches 25.

The principal electrodes 23 include transverse branches 27 and one longitudinal branch 28, with these being arranged in such a way that in each level the longitudinal branches 28 of the principal electrodes 23 extend in front of and at a certain distance from the ends of the transverse branches 11 of the secondary electrodes 5 and in such a way that the transverse branches 27 of the principal electrodes 23 and the transverse branches 11 of the secondary electrodes 5 extend opposite one another and between one another in an alternating fashion, with the ends of the transverse branches 27 being at a certain distance from the longitudinal branches 13.

The principal electrodes 23 are connected by vias 29 that connect their longitudinal branches 28.

The principal electrodes 22 and the principal electrodes 23 are identical. Their transverse branches 24 and 27 are at equal distances from each other and at equal distances from the transverse branches 9 and 12.

Thus, in each level, the principal electrodes 22 and the principal electrodes 23 constitute longitudinally continuous combs, the transverse branches 24 and 27 of which are engaged between the transverse branches 9 and 12 of the interrupted combs of the secondary electrodes 4 and 5.

In one of the levels, the longitudinal branch 10 of a secondary end electrode 4 is extended so as to constitute a longitudinal external electrical connection branch 30 of the aforementioned group 18 and the longitudinal branch 13 of a secondary end electrode 5 is extended so as to constitute a longitudinal external electrical connection branch 31 of the aforementioned group 19, with these external electrical connection branches 30 and 31 being connected to one or more components of the integrated circuit.

Opposite the connection branches 30 and 31, at least in one level, the transverse branches 24 and 27 of the principal electrodes 22 and 23 are extended within one level in order to be joined up by an extension 33a, so as to constitute a principal group 32 of stacked principal electrodes, with a central longitudinal external electrical connection branch 33 being connected to this extension so as to connect this group 32 to one or more components of the integrated circuit.

Thus, the capacitors formed between the group 32 of principal electrodes and the groups 18 and 19 of secondary electrodes are imbricated and composed alternately in such a way that they are suitable for exhibiting identical or almost identical electrical characteristics.

FIGS. 4 to 6 show a capacitive base structure of an integrated circuit according to another embodiment of the present invention. In this embodiment, the capacitive structure 34 has a base structure corresponding to that of the embodiment of FIGS. 1 to 3, but which differs therefrom because its secondary stacks 35 and 36, which are connected together successively and alternately by inclined branches 37 and 38 so as to constitute secondary groups 39 and 40, comprise secondary electrodes 41 and 42 having five uniformly spaced transverse branches 43 and 44 connected to longitudinal branches 45 and 46.

As in the embodiment of FIGS. 1 to 3, the capacitive structure 34 comprises a group 47 of principal stacks 48 and 49 associated with the secondary stacks 35 and 36 and comprising principal electrodes 50 and 51 having transverse branches 52 and 53 connected to longitudinal branches 54 and 55.

The principal electrodes 50 and 51 of the principal stacks 48 and 49 of the capacitive structure 34 furthermore include complementary transverse branches 56 and 57 opposite their transverse branches 52 and 53.

The capacitive structure 34 furthermore includes complementary secondary stacks 58 and 59 arranged in two complementary longitudinal rows 60 and 61 and comprising complementary secondary electrodes 62 and 63 arranged in each level symmetrically to the secondary electrodes 41 and 42 in relation to the longitudinal branches 54 and 55 of the principal electrodes 50 and 51.

The complementary secondary electrodes 62 and 63 comprise five transverse branches 64 and 65 associated with, and at a certain distance from, the complementary transverse branches 56 and 57 of the principal electrodes 50 and 51 and connected to longitudinal branches 66 and 67 extending at a certain distance from the ends of these branches 50 and 51.

As shown in FIG. 6, the complementary secondary electrodes 63 of each complementary secondary stack 59 are connected by means of vias 68 connecting their longitudinal branches 67. The same applies with regard to the complementary secondary electrodes 62 of each complementary secondary stack 58.

As also shown in FIG. 6, at least one of the transverse branches 65 of the complementary secondary electrodes 63 of the complementary secondary stacks 59 and the corresponding transverse branch 44 of the secondary electrodes 42 of the secondary stacks 36 extend so as to be joined up by extensions 69 in such a way that the secondary stacks 36 are connected to the complementary secondary stacks 59 facing one another transversely. The same applies with regard to the secondary stacks 35 and the complementary secondary stacks 58.

Thus, the secondary groups 39 and 40 furthermore include, successively and alternately, the complementary secondary stacks 58 and 59, respectively associated with the complementary transverse branches 57 of the principal group 47 of principal stacks 48 and 49.

As in the previous embodiment, the principal group 47 includes a central longitudinal external electrical connection branch 70. The secondary groups 39 and 40 furthermore include transverse external electrical connection branches 71 and 72, with these being connected to the longitudinal branches 67 of one of their complementary secondary stacks 59 in this embodiment.

As in the previous embodiment, the capacitors formed between the principal group 47 and the secondary groups 39 and 40 of secondary electrodes are imbricated and composed in an alternating manner in such a way that they are suitable for exhibiting identical or almost identical electrical characteristics.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A capacitive structure produced in levels of an integrated circuit, said capacitive structure comprising:
secondary stacks of superposed secondary electrodes arranged in at least two longitudinal rows and transversely facing one another, each of the secondary electrodes including transverse branches connected by a longitudinal branch such that the longitudinal branches are facing one another;
third connection means for connecting the superposed secondary electrodes of each of the secondary stacks;

first and second connection means for successively and alternately connecting the secondary stacks of one row to the secondary stacks of another row so as to constitute a first secondary group of secondary stacks that are connected together and a second secondary group of secondary stacks that are connected together, such that the secondary stacks of the first secondary group are located transversely facing the secondary stacks of the second secondary group and such that, in each row, the secondary stacks of the first secondary group and the secondary stacks of the second secondary group are arranged alternately;

at least two principal stacks of superposed principal electrodes, each of the principal electrodes including transverse branches that are connected by a longitudinal branch, such that the longitudinal branches of the principal electrodes extend in front of and at a certain distance from the ends of the transverse branches of the rows of secondary electrodes, and such that the transverse branches of the principal electrodes and the transverse branches of the secondary electrodes of the rows extend opposite one another and between one another in an alternating fashion;

fourth connection means for connecting the superposed principal electrodes of each of the principal stacks;

fifth connection means for connecting the principal stacks so as to constitute a principal group of principal stacks of principal electrodes; and electrical connection branches, a first of the electrical connection branches being connected to the first secondary group of secondary stacks, a second of the electrical connection branches being connected to the second secondary group of secondary stacks, and a third of the electrical connection branches being connected to the principal group of principal stacks.

2. The capacitive structure according to claim 1, wherein the third and fourth connection means comprise vias that connect longitudinal branches.

3. The capacitive structure according to claim 1, wherein the first and second connection means comprise linking branches that are formed in different levels.

4. The capacitive structure according to claim 1, wherein the longitudinal branches of the secondary electrodes of each row are aligned.

5. The capacitive structure according to claim 1,
wherein the principal electrodes comprise complementary transverse branches opposite the transverse branches of the principal electrodes, and
the capacitive structure further comprises:
complementary secondary stacks comprising complementary secondary electrodes each having transverse branches connected by a longitudinal branch, the complementary secondary stacks being arranged such that the longitudinal branches of the complementary secondary electrodes extend in front of and at a certain distance from the ends of the complementary transverse branches of the principal electrodes, and such that the complementary transverse branches of the principal electrodes and the transverse branches of the complementary secondary electrodes extend between one another in an alternating fashion;
sixth connection means for connecting the complementary secondary electrodes of each of the complementary secondary stacks; and
seventh connection means for connecting the complementary secondary stacks to the secondary stacks.

6. The capacitive structure according to claim 5, wherein the complementary secondary electrodes arranged one above another are connected by vias that connect the longitudinal branches.

7. A capacitive structure comprising:
secondary stacks of superposed secondary electrodes arranged in at least two longitudinal rows, each of the secondary electrodes including transverse branches connected by a longitudinal branch such that the longitudinal branches face one another;
a third connector connecting the superposed secondary electrodes of each of the secondary stacks;
first and second connectors successively and alternately connecting the secondary stacks of one row to the secondary stacks of another row so as to constitute a first secondary group of secondary stacks that are connected together and a second secondary group of secondary stacks that are connected together, such that the secondary stacks of the first secondary group are located transversely facing the secondary stacks of the second secondary group and such that, in each row, the secondary stacks of the first secondary group and the secondary stacks of the second secondary group are arranged alternately;
at least two principal stacks of superposed principal electrodes, each of the principal electrodes including transverse branches that are connected by a longitudinal branch, such that the longitudinal branches of the principal electrodes extend in front of and at a certain distance from the ends of the transverse branches of the rows of secondary electrodes, and such that the transverse branches of the principal electrodes and the transverse branches of the secondary electrodes of the rows extend opposite one another and between one another in an alternating fashion;
a fourth connector connecting the superposed principal electrodes of each of the principal stacks;
a fifth connector connecting the principal stacks so as to constitute a principal group of principal stacks of principal electrodes;
a first external connector connected to the first secondary group of secondary stacks;
a second external connector connected to the second secondary group of secondary stacks; and
a third external connector connected to the principal group of principal stacks.

8. The capacitive structure according to claim 7, wherein the third and fourth connectors comprise vias that connect longitudinal branches.

9. The capacitive structure according to claim 7, wherein the first and second connectors each comprise a linking branch, with the linking branches being formed in different levels.

10. The capacitive structure according to claim 7, wherein the longitudinal branches of the secondary electrodes of each row are aligned.

11. The capacitive structure according to claim 7,
wherein the principal electrodes comprise complementary transverse branches opposite the transverse branches of the principal electrodes, and
the capacitive structure further comprises:
complementary secondary stacks comprising complementary secondary electrodes each having transverse branches connected by a longitudinal branch, the complementary secondary stacks being arranged such that the longitudinal branches of the complementary secondary electrodes extend in front of and at a certain distance from the ends of the complementary transverse branches of the principal electrodes, and such that the complementary transverse branches of the principal electrodes and the transverse branches of the complementary secondary electrodes extend between one another in an alternating fashion;

a sixth connector connecting the complementary secondary electrodes of each of the complementary secondary stacks; and a seventh connector connecting the complementary secondary stacks to the secondary stacks.

12. The capacitive structure according to claim 11, wherein the complementary secondary electrodes are connected by vias.

13. An integrated circuit including at least one capacitive structure, the capacitive structure comprising:

secondary stacks of superposed secondary electrodes arranged in at least two longitudinal rows, each of the secondary electrodes including transverse branches connected by a longitudinal branch such that the longitudinal branches face one another;

a third connector connecting the superposed secondary electrodes of each of the secondary stacks;

first and second connectors successively and alternately connecting the secondary stacks of one row to the secondary stacks of another row so as to constitute a first secondary group of secondary stacks that are connected together and a second secondary group of secondary stacks that are connected together, such that the secondary stacks of the first secondary group are located transversely facing the secondary stacks of the second secondary group and such that, in each row, the secondary stacks of the first secondary group and the secondary stacks of the second secondary group are arranged alternately;

at least two principal stacks of superposed principal electrodes, each of the principal electrodes including transverse branches that are connected by a longitudinal branch, such that the longitudinal branches of the principal electrodes extend in front of and at a certain distance from the ends of the transverse branches of the rows of secondary electrodes, and such that the transverse branches of the principal electrodes and the transverse branches of the secondary electrodes of the rows extend opposite one another and between one another in an alternating fashion;

a fourth connector connecting the superposed principal electrodes of each of the principal stacks;

a fifth connector connecting the principal stacks so as to constitute a principal group of principal stacks of principal electrodes;

a first external connector connected to the first secondary group of secondary stacks;

a second external connector connected to the second secondary group of secondary stacks; and a third external connector connected to the principal group of principal stacks.

14. The integrated circuit according to claim 13, wherein the third and fourth connectors of the capacitive structure comprise vias that connect longitudinal branches.

15. The integrated circuit according to claim 13, wherein the first and second connectors of the capacitive structure each comprise a linking branch, with the linking branches being formed in different levels.

16. The integrated circuit according to claim 13, wherein the longitudinal branches of the secondary electrodes of each row of the capacitive structure are aligned.

17. The integrated circuit according to claim 13, wherein the principal electrodes of the capacitive structure comprise complementary transverse branches opposite the transverse branches of the principal electrodes, and the capacitive structure further comprises:

complementary secondary stacks comprising complementary secondary electrodes each having transverse branches connected by a longitudinal branch, the complementary secondary stacks being arranged such that the longitudinal branches of the complementary secondary electrodes extend in front of and at a certain distance from the ends of the complementary transverse branches of the principal electrodes, and such that the complementary transverse branches of the principal electrodes and the transverse branches of the complementary secondary electrodes extend between one another in an alternating fashion;

a sixth connector connecting the complementary secondary electrodes of each of the complementary secondary stacks; and a seventh connector connecting the complementary secondary stacks to the secondary stacks.

18. The integrated circuit according to claim 17, wherein the complementary secondary electrodes of the capacitive structure are connected by vias.

* * * * *